(12) United States Patent
Gruddanti et al.

(10) Patent No.: US 12,015,412 B1
(45) Date of Patent: Jun. 18, 2024

(54) DUAL PHASE CLOCK DISTRIBUTION FROM A SINGLE SOURCE IN A DIE-TO-DIE INTERFACE

(71) Applicant: ADVANCED MICRO DEVICES, INC., Santa Clara, CA (US)

(72) Inventors: Srikanth Reddy Gruddanti, Bangalore (IN); Pradeep Jayaraman, Santa Clara, CA (US); Ramon A. Mangaser, Boxborough, MA (US); Prasant Kumar Vallur, Bangalore (IN); Krishna Reddy Mudimela Venkata, Bangalore (IN); David H. McIntyre, Santa Clara, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 18/060,857

(22) Filed: Dec. 1, 2022

(51) Int. Cl.
| H03K 5/24 | (2006.01) |
| H03K 5/14 | (2014.01) |
| H03L 7/099 | (2006.01) |
| H03K 5/00 | (2006.01) |

(52) U.S. Cl.
CPC .............. H03K 5/249 (2013.01); H03K 5/14 (2013.01); H03L 7/0998 (2013.01); H03K 2005/00286 (2013.01)

(58) Field of Classification Search
CPC ..................... H03K 5/249; H03K 5/14; H03K 2005/00286; H03L 7/0998
USPC ......................................................... 327/63
See application file for complete search history.

(56) References Cited

U.S. PATENT DOCUMENTS

| 9,245,870 | B1 * | 1/2016 | Peterson ............... G06F 30/392 |
| 10,424,921 | B2 * | 9/2019 | Dubowski ............... H01L 24/08 |
| 11,574,670 | B2 * | 2/2023 | Moon ................. G11C 11/4076 |
| 11,693,808 | B2 * | 7/2023 | Noguera Serra ... G06F 15/7807 |
| | | | 710/306 |
| 2007/0232091 | A1 * | 10/2007 | Hong ................. H01R 13/6471 |
| | | | 439/66 |
| 2013/0318266 | A1 * | 11/2013 | Thomas .................. G06F 13/40 |
| | | | 710/106 |
| 2016/0034417 | A1 | 2/2016 | Chavez et al. |

(Continued)

FOREIGN PATENT DOCUMENTS

WO          2016060780 A1      4/2016

OTHER PUBLICATIONS

1 International Search Report and Written Opinion, PCT/US2022/052736, dated Mar. 27, 2023, 8 pages.

*Primary Examiner* — Ryan Jager

(57) ABSTRACT

A semiconductor package includes a first die having a phase locked loop outputting a local clock signal and a strobe signal to a first transmit block of the first die. The strobe signal has a phase offset relative to the local clock signal. A second die is aligned with the first die so each of a first plurality of connection points of the first die is substantially equidistant to a corresponding connection point of a second plurality of connection points of the second die. A plurality of connection paths of a substantially same length couple a connection points of the first plurality of connection points to corresponding connection points of the second plurality of connection points. Different connection paths transmit data signals from the first die to the second die based on the local clock signal and transmit the strobe signal from the first die to the second die.

20 Claims, 6 Drawing Sheets

(56) References Cited

U.S. PATENT DOCUMENTS

| | | |
|---|---|---|
| 2016/0147708 A1 | 5/2016 | Freudenberger et al. |
| 2016/0170934 A1* | 6/2016 | Haejong ............. G06F 13/4291 710/110 |
| 2017/0063353 A1* | 3/2017 | Coteus ...................... G06F 1/12 |
| 2022/0206608 A1* | 6/2022 | Shin .................... G06F 3/04164 |
| 2023/0195678 A1* | 6/2023 | Jayaraman .......... G06F 13/4286 710/110 |

* cited by examiner

DUAL PHASE CLOCK DISTRIBUTION FROM A SINGLE SOURCE IN A DIE-TO-DIE INTERFACE

BACKGROUND

A die-to-die interface communicatively couples dies to allow for data transfer between the dies. Data is transferred using multiple concurrently active connection paths. As an example, a byte is transferred between dies by transmitting each bit value of the byte in parallel across multiple connection paths. Where the lengths of the connection paths vary, portions of data (e.g., each bit) transmitted at the same time will arrive at different times. This varying time of data arrival is known as "skew."

DETAILED DESCRIPTION

Various die-to-die interfaces transfer data using a source synchronous, clock forwarding technique. In a source synchronous, clock-forwarding interface, a die transmitting data transmits a clock signal, also referred to as a "strobe," along with data signals. The clock signal, or strobe, is generated by the die transmitting the data signals, and the data signals are referenced to the strobe that sourced the locally generated clock signal rather than to a global clock. A source-synchronous interface enables higher data transmission speeds than other clocking configurations.

In various source-synchronous interfaces, the strobe is in quadrature with the data signal, so the strobe is 90 degrees out of phase with the data signal. This allows the strobe to be centered with transmitted data signals. Conventional die-to-die interfaces maintain the quadrature relationship between strobe and data signals by inserting a delay line along one path of the strobe. For example, a clock signal generated by a transmitting die is provided to a data transmission block along a transmission path, while a strobe path routes the clock signal through a delay line that results in an output of the delay line being a strobe that is 90 degrees out of phase with the clock signal. When a receiving die receives the clock signal from a transmitting die, the clock signal is carried through a strobe path that includes a delay line configured to output a strobe that is 90 degrees out of phase with the received clock signal.

Figure 1:
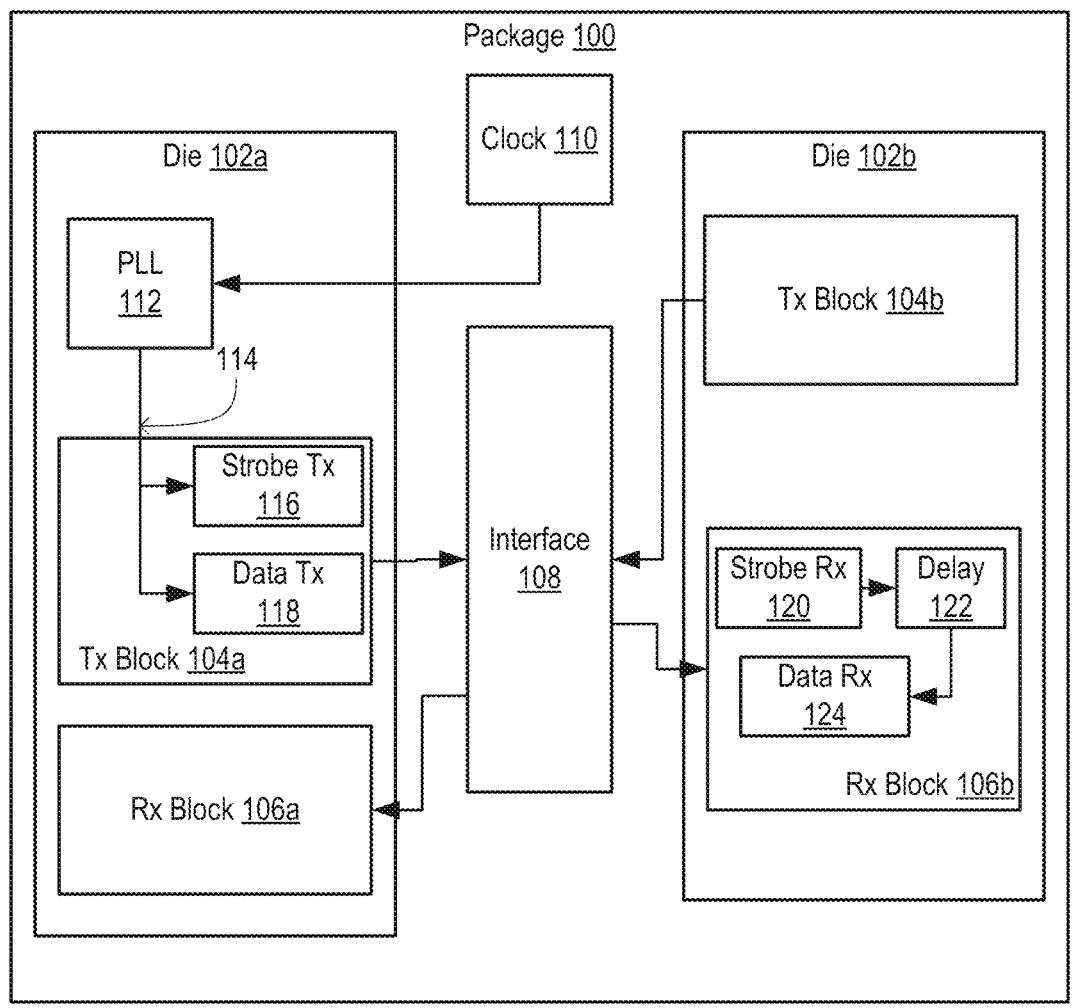
FIG. 1 is a block diagram of a conventional semiconductor package having a source synchronous die-to-die interface according to some implementations.

For purposes of illustration, FIG. 1 shows a conventional semiconductor package 100 having a source synchronous die-to-die interface. The semiconductor package 100 includes a first die 102a and a second die 102b. The first die 102a and the second die 102b are portions of semiconductive material such as silicon onto which functional circuitry is fabricated. In some implementations, the first die 102a and the second die 102b are system-on-chip (SoC) dies, chiplets, or other functional semiconductor dies as can be appreciated. In some implementations, the semiconductor package 100 includes substrate such as a printed circuit board (PCB) to which the first die 102a and the second die 102b are coupled. In some implementations, the first die 102a and the second die 102b are housed or encapsulated in an encapsulant or other molding material. The first die 102a and the second die 102b are mounted on or bonded to a carrier wafer or other structural support component.

The first die 102a and the second die 102b each include a plurality of input/output (I/O) connection points. Each I/O connection point is an area of conductive surface through which signals (e.g., data signals, clock signals) are provided to or are received from the first die 102a and the second die 102b. As an example, the I/O connection points include pins, bumps, or other components as can be appreciated. In the example semiconductor package 100, the first die 102a includes a first transmitting (Tx) block 104a and the second die 102b includes a second transmitting (Tx) block 104b. Similarly, the first die 102a includes a first receiving (Rx) block 106a, and the second die 102b includes a second receiving (Rx) block 106b. The first Tx block 104a and the second Tx block 104b each include a plurality of I/O connection points allocated or dedicated to transmitting signals to the second Rx block 106b and to the first Rx block 106a, respectively. Similarly, the first Rx block 106a and the second Rx block 106b each include a plurality of I/O connection points allocated or dedicated to receiving signals (e.g., data signals, clock signals) from the second Tx block 104b and from the first Tx block 104a, respectively.

The first die 102a and the second die 102b are communicatively coupled by an interface 108. In the example semiconductor package 100, the interface 108 couples the first die 102a to the second die 102b by coupling the first Tx block 104a to the second Rx block 106b and by coupling the second Tx block 104b to the first Rx block 106a. The interface 108 includes a plurality of connection paths. Each connection path in the interface 108 couples an I/O connection point of the first die 102a (e.g., from the first Tx block 104a) to another I/O connection point of the second die 102b (e.g., from the second Rx block 106b). The connection paths can include conductive traces, wires, pins, vias, or other conductive couplings as can be appreciated.

The semiconductor package 100 also includes a clock 110. The clock 110 generates a signal oscillating at a particular frequency in order to drive the timing of data transmissions by the first Tx block 104a and by the second Tx block 104b. Similarly, the signal from the clock 110 drives sampling of data by the first Rx blocks 106a and by the second Rx block 106b. In the implementation shown by FIG. 1, the first die 102a generates a local clock signal that is transmitted by the first Tx block 104a along with data. To generate the local clock signal, the first die 102a includes a phase locked loop (PLL) 112 that receives the signal from the clock 110. Based on the signal from the clock 110, the PLL 112 generates an output that is a local clock 114 generated by the first die 102a. Hence, the signal from the clock 110 is a reference signal to the PLL 112 that is used by the PLL 112 to generate the local clock 114. In FIG. 1, the PLL 112 generates a single local clock 114.

The local clock 114 generated by the PLL 112 is provided to the first Tx block 104a of the first die 102a. More specifically, the local clock 114 is provided from the PLL 112 to a strobe transmitter 116 in the first Tx block 104a and to a data transmitter 118 in the first Tx block 104a. Hence, a single local clock 114 from the PLL 112 is provided to both the strobe transmitter 116 and to the data transmitter 118. The local clock 114 drives transmission of data from the first Tx block 104a via the data transmitter 118. For example, the data transmitter 118 transmits data when the local clock 114 has a first value, but does not transmit data when the local clock 114 has a second value. The first Tx block 104a transmits the local clock 114 to the second Rx block 106b via the strobe transmitter 116 and the interface 108 and transmits data to the second Rx block 106b via the data transmitter 118 and the interface 108. This transmission of the local clock 114 from the first die 102a to the second die 102b results in a "forwarded" or "source synchronous" interface for transmitting data from the first die 102a to the second die 102b. The first Tx block 104a includes a data subset of I/O connection points for data transmission corresponding to the data transmitter 118 and a strobe subset of I/O connection points for transmitting the local clock 114 via the strobe transmitter 116.

The second Rx block 106b of the second die 102b includes a strobe receiver 120 and a data receiver 124. The second Rx block 106b includes a data subset of I/O connection points for data receipt corresponding to the data receiver 124 and a strobe subset of I/O connection points for receiving the local clock 114 via the strobe receiver 120. In the implementation of FIG. 1, for the local clock 114 to be ninety degrees out of phase with the transmitted data, the second Rx block 106b has a delay line 122 coupled to the strobe receiver 120. The delay line 122 introduces a temporal delay into the local clock 114. In various implementations, the delay line 122 is programmable, allowing the amount of temporal delay introduced to the local clock 114 to be adjusted. The amount of temporal delay introduced by the delay line 122 is configured so the output signal from the delay line 122 is in quadrature with the received data signals. In other words, the delay line 122 allows the second Rx block to shift the local clock 114 received from the first Tx block 104a ninety degrees relative to the data signals received from the Tx block 104a. The output signal from the delay line 122 controls when the data receiver 124 samples data received via the interface 108.

As clock speeds increase, jitter induced by supply noise or by delays in transmitting the strobe from a transmitting die to a receiving die, while maintaining a quadrature relationship between the strobe and data, limits achievable data rate for transmission of data between dies. For example, the delay line 122, further described above in conjunction with FIG. 1 causes jitter introduced by power supplied to the first die 102a and to the second die 102b to decrease a width of a data eye generated from the data and the strobe. As the eye width decreases, an amount of time available to sample data at the receiver is also reduced. This reduction in data eye width limits a maximum data rate for transmitting data between dies.

To reduce jitter affecting data transmission, the present specification describes a first die including a PLL, or other clock generating circuitry, that outputs a local clock signal and a strobe signal. The strobe signal has a phase offset (e.g., 90 degrees) from the local clock signal. The local clock signal and the strobe signal are separately distributed from the PLL. The first die, a second die, and an interface between the dies, are configured so routing delays for the local clock signal transmitted from the PLL of the first die to a data receiver in the second die are substantially equal to routing delays for the strobe signal. This allows the phase offset between the local clock signal and the data signal to be established when the local clock signal and the data signal are generated without additional circuitry, such as a delay line, and maintains the phase offset through die-to-die communication, reducing sources of jitter. Further, separately distributing the clock signal and the strobe signal allows for finer control of clock gating, enabling use or more low power states that reduce overall power consumption.

To that end, the following disclosure provides a semiconductor package for skew matching in a die-to-die interface. The semiconductor package includes a first die including a phase locked loop. The phase locked loop is configured to output a local clock signal and is configured to output a strobe signal having a phase offset relative to the local clock signal. The local clock signal is routed to a first transmit block of the first die and the strobe signal is routed to the first transmit block of the first die. In some aspects, a second die is aligned with the first die such that each connection point of a first plurality of connection points of the first die is substantially equidistant to a corresponding connection point of a second plurality of connection points of the second die. A plurality of connection paths of a substantially same length are also included, where each connection path of the plurality of connection paths couples a respective connection point of the first plurality of connection points to the corresponding connection point of the second plurality of connection points. The plurality of connection paths includes a data subset of the connection paths for transmitting data signals from the first die to the second die based on the local clock signal. The plurality of connection paths also includes a strobe subset for transmitting the strobe signal from the first die to the second die. In some implementations, the phase offset between the local clock signal and the strobe signal is ninety degrees. In some implementations, the second die includes a memory.

In some implementations, a difference between a strobe delay and a data delay is less than a threshold. Said another way, the strobe delay is within a threshold amount of the data delay. The strobe delay results from transmitting the strobe signal from the first die to the second die via the strobe subset of the connection paths. The data delay results from transmitting the data signals from the first die to the second die via the data subset of the connection paths. The strobe delay is a combination of a delay from routing the strobe signal from the phase locked loop to the first transmit block of the first die, a delay from transmitting the strobe signal from the first die to the second die via the strobe subset of the connection paths, and a delay from routing the strobe signal from connection points of the second plurality of connection points coupled to the strobe subset of the connection paths to a second receive block of the second die in various implementations. The data delay is a combination of a delay from routing the local clock from the phase locked loop to the transmit block of the first die, a delay from transmitting a data signal from the first die to the second die via the data subset of the connection paths, and a delay from routing the data signal from connection points of the second plurality of connection points coupled to the data subset of the connection paths to the receive block of the second die.

In some implementations, the first transmit block of the first die is linearly aligned with a second receive block of the second die and a second transmit block of the second die is linearly aligned with a first receive block of the first die. The first transmit block is configured to transmit the strobe signal to a second receive block of second die via the strobe subset of the connection paths and the first transmit block is configured to transmit data signals to the receive block of the second die via the data subset of the connection paths in some implementations.

In some implementations, the semiconductor package further includes a clock coupled to the first die and the second die. The phase locked loop of the first die generating the local clock uses a signal from the clock as a reference. The first die also includes a strobe interpolator having an input coupled to the phase locked loop and an output coupled to the first transmit block. The strobe interpolator is configured to adjust a phase of the strobe signal. The first die also includes a clock interpolator having a clock input coupled to the phase locked loop and a clock output coupled to the first transmit block. The clock interpolator is configured to adjust a phase of the local clock signal.

The present specification also describes a method for transmitting data using a die-to-die interface, where the method includes generating a local clock signal at a first die and generating a strobe signal at the first die. The strobe signal has a phase offset from the local clock signal. Additionally, the method includes transmitting the strobe signal from the first die to the second die via the strobe subset of the connection paths and transmitting data signals from the first die to the second die via the data subset of the connection paths based on the local clock signal. In some implementations, the phase offset is ninety degrees. In some implementations the first die with the second die are aligned, and a first transmit block of the first die is linearly aligned with a second receive block of the second die and a first transmit block of the second die is linearly aligned with a second receive block of the first die.

In some implementations, a strobe delay from transmitting the strobe signal from the first die to the second die via the strobe subset of the connection paths is within a threshold amount of a data delay from transmitting the data signals from the first die to the second die via the data subset of the connection paths. The strobe delay is a combination of a delay from routing the strobe signal from a local clock generation circuit of the first die to a first transmit block of the first die, a delay from transmitting the strobe signal from the first die to the second die via the strobe subset of the connection paths, and a delay from routing the strobe signal from connection points of the second plurality of connection points coupled to the strobe subset of the connection paths to a second receive block of the second die in some implementations. Additionally, in some implementations, the data delay is a combination of a delay from routing the local clock from a local clock generation circuit of the first die the first transmit block of the first die, a delay from transmitting a data signal from the first die to the second die via the data subset of the connection paths, and a delay from routing the data signal from connection points of the second plurality of connection points coupled to the data subset of the connection paths to the second receive block of the second die.

In some aspects, generating the local clock signal at the first die includes receiving a clock signal at a local clock generation circuit included in the first die and generating the local clock signal using the clock signal as a reference for the local clock generation circuit. Generating the strobe signal at the first die, in some implementations, includes generating the strobe signal from the received clock signal using the local clock generation circuit. In some implementations, the local clock generation circuit is a phase locked loop included in the first die.

The present specification also describes a semiconductor die. The semiconductor die includes a phase locked loop and a transmit block. The transmit block includes a first plurality of connection points and a first plurality of connection segments. The first phase locked loop is configured to output a local clock signal and to output a strobe signal having a phase offset relative to the local clock signal. The local clock signal and the first strobe signal are routed to the first transmit block. Each of the first connection segments is coupled to one of the first plurality of connection points and is configured to form a connection path. Such a connection path is formed by coupling each of the first connection segments to one of a second plurality of connection segments of a second die. Each of the second plurality of connection segments is coupled to one of a second plurality of connection points of the second die. Each connection path has a substantially same length. In some aspects, each of the first plurality of connection points is configured to be substantially equidistant to a corresponding one of the second plurality of connection points of the second die when the second die is aligned with the first die.

The following disclosure provides many different examples for implementing various features of the provided subject matter. Specific components and arrangements described below are merely examples and are not intended to be limiting. For example, the formation of a first feature over or on a second feature in the description that follows does not limit implementations in which the first and second features are formed in direct contact, or implementations in which additional features are formed between the first and second features, such that the first and second features are not in direct contact. Further, spatially relative terms, such as "beneath," "below," "lower," "above," "upper," "back," "front," "top," "bottom," and the like, are used herein for ease of description to describe one element or feature's relationship to another element or feature as illustrated in the figures. Similarly, terms such as "front surface" and "back surface" or "top surface" and "bottom surface" are used herein to more easily identify various components, and indicate that those components are, for example, on opposing sides of another component. The spatially relative terms are intended to encompass different orientations of the device in use or operation in addition to the orientation depicted in the figures.

Figure 2:
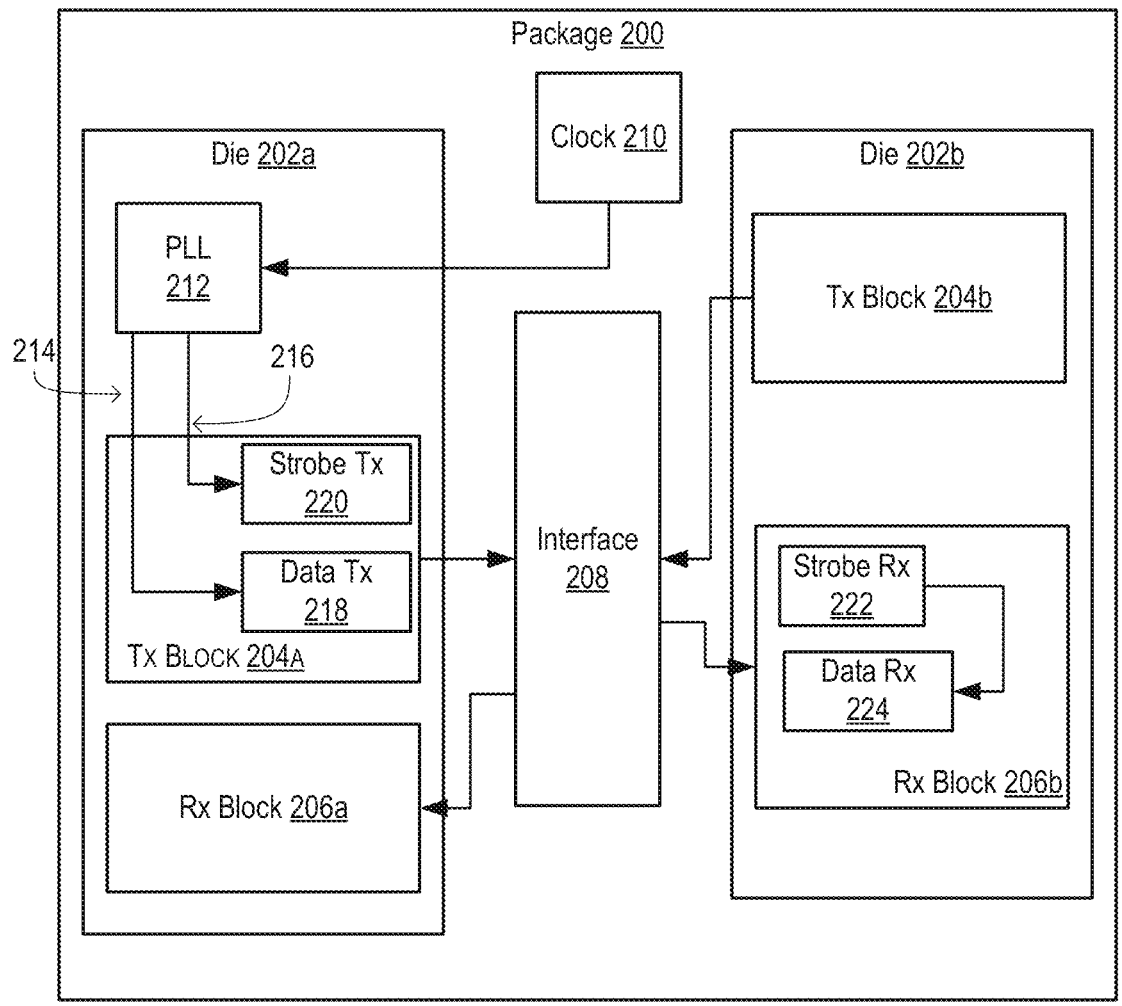
FIG. 2 is a block diagram of a semiconductor package configured to reduce jitter in a synchronous die-to-die interface according to some implementations.

FIG. 2 is a block diagram of a non-limiting example semiconductor package 200. The example package 200 can be implemented in a variety of computing devices, including mobile devices, personal computers, peripheral hardware components, gaming devices, set-top boxes, and the like. In some implementations, the semiconductor package 100 is a processor. Such a processor is implemented, for example, in a computer as a central processing unit (CPU), as a processor core of a parallel accelerator (such as a graphics processing unit (GPU)), as a machine learning accelerator, or can otherwise be implemented as can be appreciated by one skilled in the art.

The semiconductor package 200 includes a first die 202a and a second die 202b. The first die 202a and the second die 202b are portions of semiconductive material such as silicon onto which functional circuitry is fabricated. In some implementations, the first die 202a and the second die 202b are system-on-chip (SoC) dies, chiplets, or other functional semiconductor dies as can be appreciated. In some implementations, the semiconductor package 200 includes a substrate to which the first die 102a and the second die 102b are coupled. In some implementations, the first die 202a and the second die 202b are housed or encapsulated in an encapsulant or other molding material. In some implementations, the first die 202a and the second die 202b are mounted on or bonded to a carrier wafer or other structural support.

The first die 202a and the second die 202b each include a plurality of input/output (I/O) connection points. Each I/O connection point is an area of conductive surface through which signals (e.g., data signals or clock signals) are provided to or are received from the first die 202a or the second die 202b. As an example, the I/O connection points include pins, bumps, or other components as can be appreciated. In the example semiconductor package 200 of FIG. 2, the first die 202a includes a first Tx block 204a (first 'transmitting' block) and a first Rx block 206a (first 'receiving' block). Similarly, the second die 202b includes a second Tx block 204b and a second Rx block 206b. The first Tx block 204a includes a plurality of I/O connection points allocated or dedicated to transmitting signals to the second Rx block 206b. The second TX block 204b, includes a plurality of I/O connection points allocated or dedicated to transmitting signals to the first Rx block 206a. The Rx blocks 206a, 206b each include a plurality of I/O connection points allocated or dedicated to receiving signals (e.g., data signals or clock signals) from the aforementioned Tx blocks.

An interface 208 communicatively couples the first die 202a to the second die 202b. In the example semiconductor package 200, the interface 208 couples the first die 202a to the second die 202b by coupling the first Tx block 204a to the second Rx block 206b and by coupling the first Rx block 206b to the second Tx block 204b. The interface 208 includes a plurality of connection paths. Each connection path in the interface 208 couples an I/O connection point of the first die 202a (e.g., from the Tx block 204a) to another I/O connection point of the other second die 202b (from the Rx block 206b). Examples of connection paths include conductive traces, wires, pins, vias, or other connection paths as can be appreciated.

In some implementations, the interface 208 includes a bridge die. A bridge die is a die of semiconductive material (e.g., silicon) onto which the connection paths are fabricated. In some implementations, the interface 208 includes conductive traces (e.g., fanout traces or other traces as can be appreciated) housed or fabricated in one or more redistribution layers. Such redistribution layers include successive layers of dielectric material such as polyamide into which conductive traces and other conductive materials (e.g., pads, plates, vias, and the like) are housed in order to form the conductive connection pathways between the first die 202a and the second die 202b.

The first die 202a and the second die 202b are aligned in the semiconductor package 200 so each pair of I/O points are substantially equidistant. In other words, each I/O connection point of the first die 102a is located a substantially same distance from its corresponding I/O connection point in the second die 102b. Each pair of I/O connection points are connected using a connection path in the interface 108 of a substantially same length. As each connection path has approximately the same length and the same conductive characteristics, a simultaneous transmission of multiple signals from the first die 202a will be received substantially simultaneously at the second die 202b, and vice versa. In some implementations, a layout of the I/O connection points in the first die 202a (e.g., in the first Tx block 204a and first Rx block 206a) corresponds to a one-hundred-and-eighty-degree rotation of a layout of the I/O connection points in the second die 202b (e.g., in the Tx block 204b and the Rx block 206b). In other words, the layout of the I/O connection points in the first die 202a is flipped once across each of the X-axis and Y-axis in order to define the layout of the I/O connection points in the second die 202b.

Figure 3:
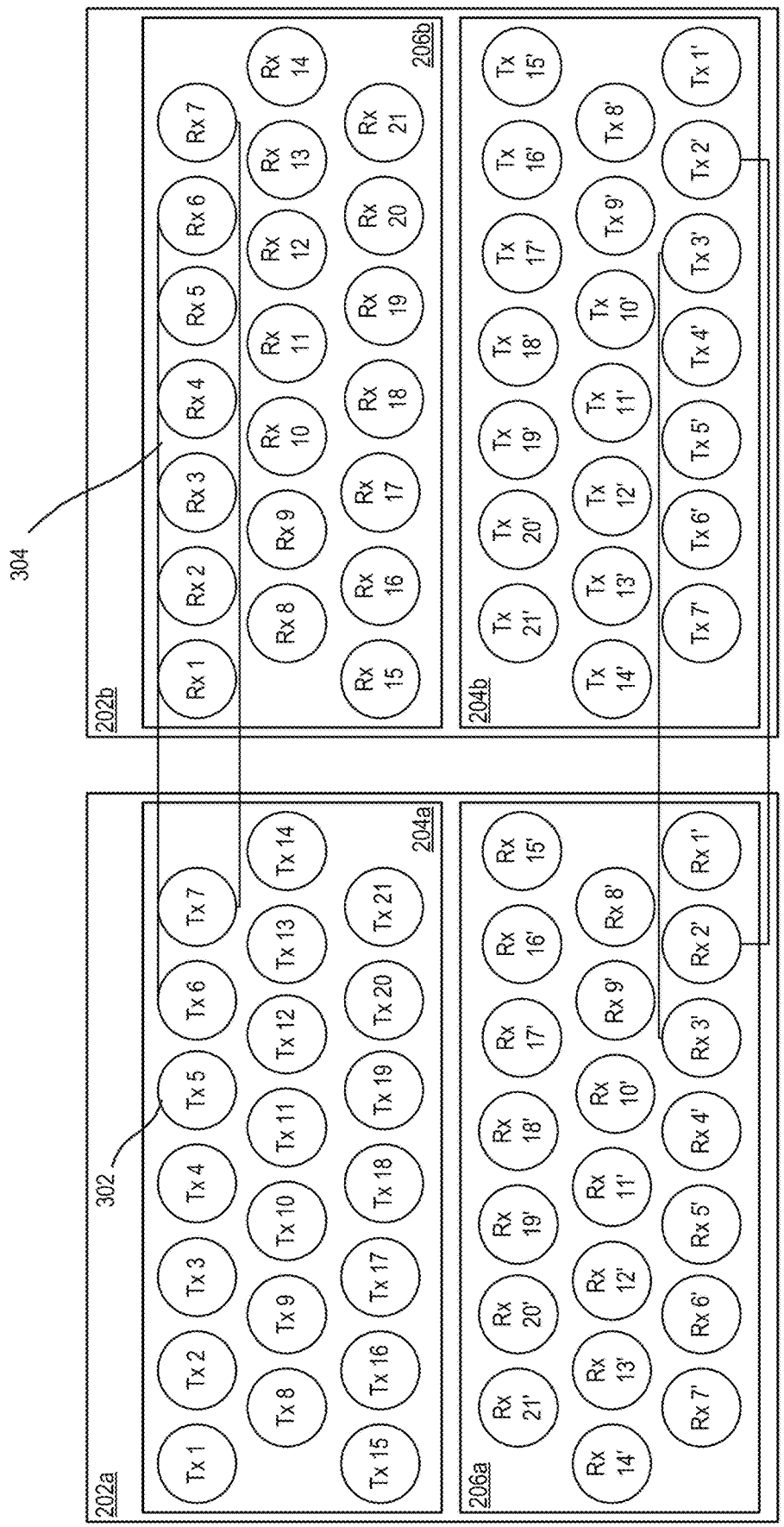
FIG. 3 is diagram of an example layout for input/output connection points for skew matching in a die-to-die interface according to some implementations.

FIG. 3 shows an example layout of I/O connection points for die-to-die communications. FIG. 3 shows the first die 202a placed side-by-side with the second die 202b. The first die 202a and the second die 202b each include multiple I/O connection points 302 grouped into a first Tx block 204a and a first Rx block 206a on the first die 202a and grouped into a second Tx block 204b and a second Rx block 206b on the second die 202b. The first Tx block 204a of the first die 202a is linearly aligned with the Rx block 206b of the second die 202b. Similarly, the second Tx block 204b of the second die 202b is linearly aligned with the first Rx block 206a of the first die 202a.

Each I/O connection point 302 includes a label "Tx 1"-"Tx 21,"-"Rx 1"-"Rx 21,"-"Tx 1'-Tx21'" and "Rx1'-Rx21'" in the example of FIG. 3. As shown, the I/O connection points of the second die 102b reflect a one-hundred-and-eighty-degree rotation of the I/O connection points of the first die 102a. As an example, I/O connection point 302 "Tx 1" is located in the upper left corner of the first Tx block 204a. A matching I/O connection point 302 "Tx 1'" is located in the lower right corner of the second Tx block 204b. As another example, I/O connection point 302 "Rx 7" is located in the lower left corner of the first Rx block 206a. A matching I/O connection point 302 "Rx 7'" is located in the upper right corner of the second Rx block 206b. In other words, as shown in FIG. 3, the first die 202a and the second die 202b are constructed to have matching layouts of I/O connection points 302, with one of the first die 202a or the second die 202b rotated one-hundred-and-eighty-degrees relative to the other one of the first die 202a or the second die 202b for placement (e.g., in a semiconductor package 200). To align the pairs of I/O connection points 302.

Assume that some transmitting I/O connection points 302 of a first die 202a are connected via an interface 208 (not shown) a receiving I/O connection point 302 in the second die 202b having a same numbered label. In the example of FIG. 3, connection paths 304 are used to couple I/O connection points 302 "Tx 6" with "Rx 6," "Tx 7" with "Rx 7," "Tx 3'" with "Rx 3'" and "Tx 2'" with "Rx 2'." As shown, due to their relative placements, each pair of coupled I/O connection points 302 are substantially the same distance apart, and are thus couplable using connection paths 304 of substantially the same length.

One skilled in the art will appreciate that the example layout of FIG. 3 is merely illustrative and that other layouts and configurations of the first die 202a and the second die 202b, I/O connection points 302, and connection paths 304 are also contemplated within the scope of the present disclosure. In some examples, each of the dies 202a, 202b also includes a redistribution layer (RDL) that includes connection segments (such as conductive traces). Each connection segment of the first die 202a is coupled to one of the connection points 302 of the first die 202a. Similarly, each connection segment of the second die 202b is coupled to one of the connection points of 302 of the second die 202b. A connection segment of one die can be coupled to a connection segment of the other die to form a connection path 304 between two connection points. For example, a connection segment coupled to connection point Tx 6 of the first die 202a can form a connection path with a connection segment that is coupled to connection point Rx 6 of the second die 202b. The connection segments from one die may be coupled to connection segments of a second die through an interposer, through a bridge device, direction (a single RDL is coupled to both dies), and in other ways as will occur to readers of skill in the art.

Having the connection paths between I/O connection points on the first die 202a and on the second die 202b substantially the same length prevents signals transmitted simultaneously from the first die 202a from being received at different times at the second die 202b because of differing lengths of connection paths used to transmit different signals. In contrast, conventional die-to-die communications have conductive pathways of differing lengths in the interface 108, resulting in different signals arriving at a die at different times, based on which conductive pathway is used for each signal.

Referring back to FIG. 2, the semiconductor package 200 also includes a clock 210 coupled to the first die 202a and to the second die 202b. The clock 210 generates a signal oscillating at a particular frequency that is used to drive the timing of data transmissions by the first Tx block 204a and by the second Tx block 204b. The clock also drives the sampling of data by the first Rx block 206a and by the second Rx block 206b. To reduce jitter from signals arriving at a die 202a,b at different times, the first die 202a includes a phase locked loop 212 that is coupled to the clock 210. The phase locked loop 212 generates a local clock signal 214 using a signal received from the clock 210 as a reference. While FIG. 2 shows the first die 202a including the phase locked loop 212, in other implementations, the first die 202a includes a different type of local clock generation circuit that generates the local clock signal 214 using the signal received from the clock 210 as a reference. In various implementations, the local clock signal 214 has a different frequency than a frequency of the signal from the clock 210. For example, the local clock signal 214 can be a higher frequency than a frequency of the signal from the clock 210.

To further mitigate jitter caused by signals transmitted from the first die 202a being received at the second die 202b at different times, the phase locked loop 212 of the first die 202a also generates a strobe signal 216 based on the received signal from the clock 210. In various implementations, a frequency of the local clock signal 214 equals a frequency of the strobe signal 216. The strobe signal 216 has a phase offset relative to the local clock signal 214. For example, the phase offset between the strobe signal 216 and the local clock signal 214 is ninety degrees. The phase offset between the strobe signal 216 and the local clock signal 214 is a fixed or a constant value.

Figure 4:
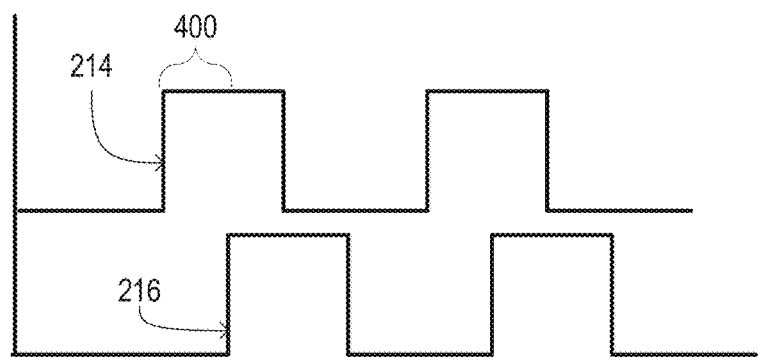
FIG. 4 is an example of a local clock signal and a strobe signal generated by a die in a semiconductor package according to some implementations.

Turning briefly to FIG. 4, an example of the local clock signal 214 and the strobe signal 216 is depicted. The phase offset 400 between the local clock signal 214 and the strobe signal 216 is ninety degrees. Having the phase offset 400 of ninety degrees causes a rising edge of the strobe signal 216 to occur halfway through a time period when the local clock signal 214 has a maximum value. Thus, for half of the time period when the local clock signal 214 has a maximum value, both the local clock signal 214 and the strobe signal 216 have the maximum value, while for another half of the time period when the local clock signal 214 has the maximum value, the strobe signal 216 has a minimum value.

Returning to FIG. 2, in various embodiments, the phase locked loop 212 generates different output signals with different phases relative to the signal from the clock 210. To generate output signals with different phases relative to the signal from the clock 210 the phase locked loop 212 may include a delay loop, with different output signals of the phase locked loop 212 from different locations in the delay loop. A first output signal, for example, may have a phase that tracks a phase of the signal from the clock 210, while a second output signal has a phase offset of ninety degrees from the signal from the clock 210. The first output signal is used as the local clock signal 214, while the second output is used as the strobe signal 216. In various implementations, the phase locked loop 212 may have different numbers of outputs, with different outputs having different phase offsets relative to the signal from the clock 210. This allows the phase offset of local clock signal 214 relative to the strobe signal 216 to be based on the outputs of the phase locked loop 212 that is selected for the local clock signal 214 and for the strobe signal 216.

The local clock signal 214 and the strobe signal 216 are both routed from the phase locked loop 212 to the first Tx block 204a of the first die 202a. In the implementation shown in FIG. 2, the local clock signal 214 is routed from the phase locked loop 212 to a data transmitter 218 in the first Tx block 204a. Similarly, the strobe signal 216 is routed from the phase locked loop 212 to a strobe transmitter 220 in the first Tx block 204a. Hence, the semiconductor package 200 in FIG. 2 has separate signals routed from the phase locked loop 212 to the data transmitter 218 and to the strobe transmitter 220. In contrast, the conventional semiconductor package 100 described above in conjunction with FIG. 1 has a PLL 112 with a single output signal of a local clock 114 that is routed from the PLL 112 to both the strobe transmitter 116 and the data transmitter 118 in the first Tx block 104a of the first die 102a.

The first die 202a transmits the strobe signal 216 to the second die 202b along with data signals, as further described below, and the second Rx block 206b of the second die 202b samples the received data signals using the strobe signal 216. Hence, the Rx block 206b of the second die 202b uses the strobe signal 216 from the first die 202a to determine when to sample data signals received from the first Tx block 204a of the first die 202a. Such transmission of the strobe signal 216 from the first die 202a to the second die 202b implements a "forwarded" or a "source-synchronous" clock signal. Use of the strobe signal 216 as a source-synchronous clock signal for the second die 202b allows the semiconductor package 200 to support higher data rates for transmitting data between the first die 202a and the second die 202b compared to implementations where the signal from the clock 210 is used by both the first die 202a and the second die 202b to control data transmission and data sampling, respectively.

To enable transmission of the strobe signal 216 and data signals, the plurality of connection paths of substantially the same length between connection points of the first die 202a and corresponding connection points of the second die 202b include a data subset. A connection path in the data subset couples a connection point of the first die 202a corresponding to the data transmitter 218 of the first Tx block 204a to a connection point of the second die 202b corresponding to a data receiver 224 of the second Rx block 206b. A connection path in the strobe subset couples a connection point of the first die 202a corresponding to the strobe transmitter 220 of the first Tx block 204a to a connection point of the second die 202b corresponding to a strobe receiver 222 of the second Rx block 206b. Hence, the connection paths between the first die 202a and the second die 202b include connection paths for data transmission—the data subset— and separate connection paths for strobe transmission—the strobe subset. In various implementations, the data subset includes a greater number of connection paths than the strobe subset. The data subset, in some example implementations, includes 36 connection paths, while the strobe subset includes two connection paths.

In some implementations, a difference (the 'absolute difference') between a strobe delay and a data delay experienced at an Rx block is less than a threshold. The less the difference between the strobe and data delays the more precise the phase relationship is between the strobe and data signals at the Rx block. That is, a difference in strobe and data delays of zero means that delay introduced in the strobe signal during transmission to the Rx block is the same as the delay introduced to the data signal during transmission to the Rx block. Said another way, the strobe delay resulting from transmitting the strobe signal 216 from the first die 202a to the second die 202b via the strobe subset of the connection paths is within a threshold amount of a data delay resulting from transmitting the data signals from the first die 202a to the second die 202b via the data subset of the connection paths. For example, the strobe delay equals the data delay.

In FIG. 2, as an example, if the difference between the strobe and data delay (as experienced at the second Rx Block 206b) is less than a threshold, the phase relationship between the strobe signal 216 and the local clock signal 214 used by the first Tx block 204a to transmit data is maintained when the strobe signal 216 and the data signals are received by the second Rx block 206b of the second die 202b. To have the strobe and data delay be relatively similar (and thus, the difference between the two relatively low), the semiconductor package 200 is configured so a path length of the strobe signal 216 from the phase locked loop 212 of the first die 202a to a sampling latch in the second Rx block 206b of the second die 202b is substantially equal to a path length of the local clock signal 214 from the phase locked loop 212 of the first die 202a to a destination point of a data signal at the sampling latch of the second Rx block 206b of the second die 202b. The strobe delay for the strobe signal 216 accounts for physical distance between the phase locked loop 212 and the second Rx block 206b (accounting for lengths of the connection paths in the strobe subset and lengths between the phase locked loop and the connection points of the first die 202a, as well as lengths between the connection points of the second die 202b and the second Rx block 206b), as well as components that the strobe signal 216 is routed through. In various implementations, the strobe delay is determined as a combination of a delay from routing the strobe signal 216 from the phase locked loop 212 to the first Tx block 204a of the first die 202b, a delay from transmitting the strobe signal 216 from the first die 202a to the second die 202b via the strobe subset of the connection paths, and a delay from routing the strobe signal 216 from connection points of the second plurality of connection points coupled to the strobe subset of the connection paths to the second Rx block 206b of the second die 202b. As such, the strobe delay accounts for sources of temporal delay during transmission of the strobe signal 216 from the phase locked loop 212 of the first die 202a to the second Rx block 206b of the second die 202b.

Similarly, the data delay accounts for physical distance between the phase locked loop 212 and the second Rx block 206b (accounting for lengths of the connection paths in the data subset, lengths between the phase locked loop 212 and the connection points of the first die 202a, and lengths between the connection points of the second die 202b and the second Rx block 206b), as well as components that the local clock signal 214 and the data signal is routed through. In some implementations, the data delay is a combination of a delay from routing the local clock signal 214 from the phase locked loop 212 to the first transmit block 204a of the first die 202a, a delay from transmitting a data signal from the first die 202a to the second die 202b via the data subset of the connection paths, and a delay from routing the data signal from connection points of the second plurality of connection points coupled to the data subset of the connection paths to the second receive block 206b of the second die 202b. Thus, the data delay accounts for sources of temporal delay for the local clock signal 214 or for a data signal along a path from the phase locked loop 212 of the first die 202b to the second Rx block 206b of the second die 202b. Configuring the first die 202a, the second die 202b, and the interface 208 so the strobe delay is within the threshold amount of the data delay allows the phase offset between the strobe signal 216 and the local clock signal 214 to be maintained from the phase locked loop 212 to the second Rx block 206b by removing sources of time delays affecting one of the strobe signal 216 and the local clock signal 214 (or a data signal). This prevents differences in propagation time for the strobe signal 216 and the local clock signal 214 (or the data signal) from altering the phase offset between the strobe signal 216 and the local clock signal 214 produced by the phase locked loop 212.

The second Rx block 206b of the second die 202b includes a strobe receiver 222 and a data receiver 224. The strobe receiver 222 is coupled to connection points of the second die 202b that are coupled to connection paths in the strobe subset. Hence, the strobe receiver 222 receives the strobe signal 216 generated by the first die 202a. The data receiver 224 is coupled to connection points of the second die 202b that are coupled to connection paths in the strobe subset, so the data receiver 224 receives data signals transmitted by the first die 202a. The strobe receiver 222 is coupled to the data receiver 224, with the strobe receiver 222 routing the received strobe signal 216 from the first die 202a to the data receiver 224. In various embodiments, the data receiver 224 includes a sampling latch that receives the strobe signal 216 and receives the data signal. The sampling latch samples the data signal based on the strobe signal 216. For example, the sampling latch samples the data signal at a rising edge of the strobe signal 216. In other examples, the sampling latch samples the data signal at a falling edge of the strobe signal 216, while in other examples, the sampling latch samples the data signal at a rising edge of the strobe signal 216 and at a falling edge of the strobe signal 216.

Generating the local clock signal 214 and the strobe signal 216, which has a phase offset from the local clock signal 214, at the phase locked loop 212 of the first die 202a, the semiconductor package 200 establishes a phase offset between the strobe signal 216 and data signals, which are transmitted based on the local clock signal 214, without using the delay line 122 of the conventional semiconductor package 100 shown in FIG. 1. Removing such a conventional delay line from the second die 202b (or from the first die 202a) reduces power consumption of the semiconductor package 200 and reduces an overall area for a Tx block 204a,b or for Rx block 206a,b. Further, removing such a delay line simplifies training of the semiconductor package. With a delay line, to maintain a phase offset between a data signal and a strobe signal, a semiconductor package is trained by identifying both edges of a data eye and using those to find the center of the data eye, with the center of the data eye used to program/refine the time delay introduced by the delay line. In contrast, generating the strobe signal 216 and the local clock signal 214 by a phase locked loop 212 and minimizing the strobe delay and data delay allows the phase offset between the strobe signal 216 and data signals to be maintained without training based on data eye characteristics.

In some implementations, the second die 202b is a memory, and the first die 202a is a processor. Hence, the semiconductor package 200 described above in conjunction with FIGS. 2-4 allows for increased data rates in the processor (e.g., the first die 202a) writing data to the memory (e.g., the second die 202b) by reducing clock jitter between the strobe signal 216 and the local clock signal 214 used by the processor to time transmission of data via the interface 208 to the memory.

Figure 5:
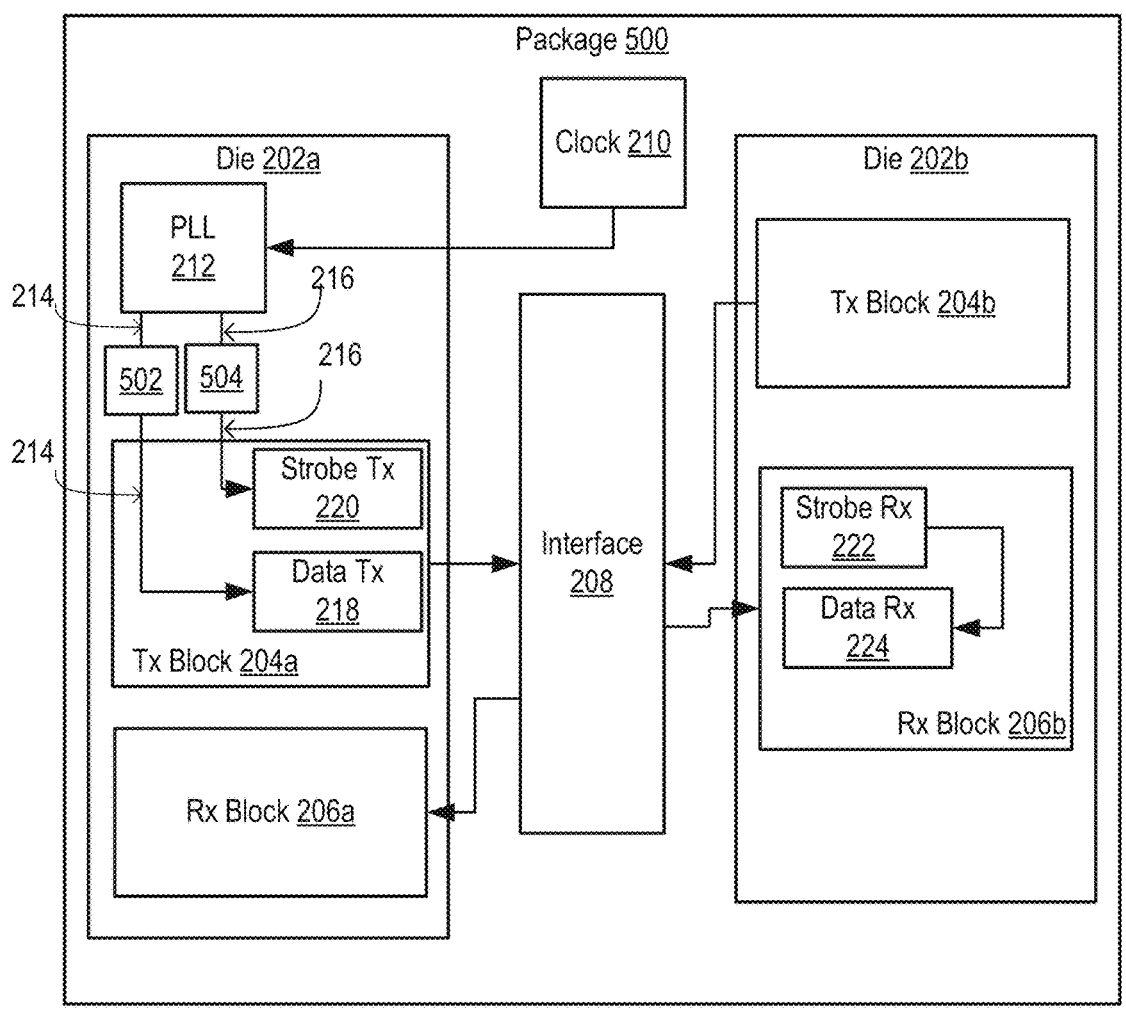
FIG. 5 is a block diagram of another example semiconductor package configured to reduce jitter in a synchronous die-to-die interface according to some implementations.

FIG. 5 is a block diagram of another non-limiting example semiconductor package 500. The semiconductor package 500 includes a first die 202a and a second die 202b, generally similar to those described above in conjunction with FIG. 2. In semiconductor package 500, the local clock signal 214 output by the phase locked loop 212 is input to a clock interpolator 502. The clock interpolator 502 receives a control signal and adjusts a phase of the local clock signal 214 based on the control signal. The output of the clock interpolator 502 is routed to the first Tx block 204a and used to determine when data is transmitted by the first Tx block 204a. Inclusion of the clock interpolator 502 between the phase locked loop 212 and the first Tx block 204a allows for further adjustment of a phase of the local clock signal 214. Such further adjustment of the phase of the local clock signal 214 allows for finer granularity in specifying the phase offset between the strobe signal 216 and the local clock signal 214 by allowing for further adjustment of the phase of the local clock signal 214 before the local clock signal 214 reaches the first Tx block 204a.

The implementation of the semiconductor package 500 shown in FIG. 5 also has the strobe signal 216 output by the phase locked loop 212 provided as input to a strobe interpolator 504. The strobe interpolator 504 receives a control signal and adjusts a phase of the strobe signal 216 based on the control signal. The output of the strobe interpolator 504 is routed to the first Tx block 204a and transmitted from the first Tx block 204a to the second Rx block 206b via the interface 208. Positioning the strobe interpolator 504 between the phase locked loop 212 and the first Tx block 204a allows for further adjustment of a phase of the strobe signal 216. The finer granularity of phase adjustment provided by the strobe interpolator 504 allows the phase offset between the strobe signal 216 and the local clock signal 214 to be more precisely specified and maintained. Coupling the local clock signal 214 output from the phase locked loop 212 and the strobe signal 216 output from the phase locked loop 212 to the clock interpolator 502 and the strobe interpolator 504, respectively, allows for more precise calibration of the phase offset between the local clock signal 214 and the strobe signal 216. In various implementations, the clock interpolator 502 and the strobe interpolator 504 are used to identify edges of a data eye for transmitting data signals. For example, configuration of one or more of the phase interpolators 502 and the strobe interpolator 504 identifies a left edge and a right edge of the data eye for transmitting data signals. Use of one or more of the clock interpolators 502 and the strobe interpolator 504 to identify edges of a data eye simplifies identification of the edges of the data eye relative to training a delay line based on transmitted data in conventional configurations, such as the configuration shown in FIG. 1. In other implementations, the first die 202a includes the clock interpolator 502, but does not include the strobe interpolator 504. Alternatively, in some implementations, the first die 202a includes the strobe interpolator 504, but does not include the clock interpolator 502.

Figure 6:
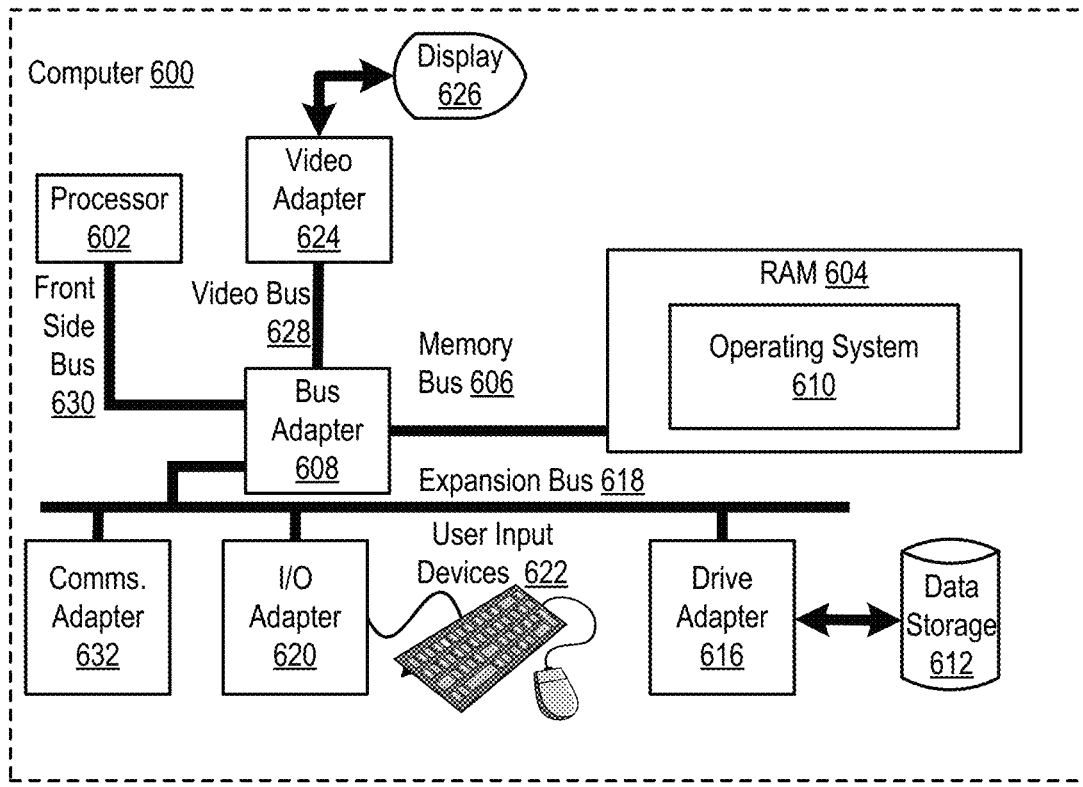
FIG. 6 is a block diagram of an example computer for skew matching in a die-to-die interface according to some implementations.

The semiconductor package 200 of FIG. 2 may be implemented in a computer, such as the example computer 600 set forth in FIG. 6. For example, the semiconductor package 200 may be implemented as at least one processor 602. In addition to at least one processor 602, the computer 600 of FIG. 6 also includes random access memory (RAM) 604 which is connected through a high speed memory bus 606 and bus adapter 608 to the processor 602 and to other components of the computer 600. Stored in RAM 604 is an operating system 610. The operating system 610 in the example of FIG. 6 is shown in RAM 604, but many components of such software typically are stored in non-volatile memory also, such as, for example, on data storage 612 which may take the form of a disk drive.

The computer 600 of FIG. 6 includes disk drive adapter 616 coupled through expansion bus 618 and bus adapter 608 to processor 602 and other components of the computer 600. Disk drive adapter 616 connects non-volatile data storage to the computer 600 in the form of data storage 612. Such disk drive adapters include Integrated Drive Electronics (IDE) adapters, Small Computer System Interface (SCSI) adapters, SATA (Serial AT Attachment) adapter, Non-Volatile Memory Express (NVMe) adapters and others as will occur to those of skill in the art. In some implementations, non-volatile computer memory is implemented as an optical disk drive, a solid state drive (SSD) based on NAND Flash, electrically erasable programmable read-only memory (EEPROM), RAM drives, and so on as will occur to those of skill in the art.

The example computer 600 of FIG. 6 includes one or more I/O' adapters 620. I/O adapters implement user-oriented I/O through, for example, software drivers and computer hardware for controlling output to display devices, such as computer display screens, as well as user input from user input devices 622, such as keyboards and a mouse. The example computer 600 of FIG. 6 includes a video adapter 624, which is an example of an I/O adapter specially designed for graphic output to a display device 626, such as a display screen or computer monitor. Video adapter 624 is connected to processor 602 through a high speed video bus 628, bus adapter 608, and the front side bus 630, which is also a high speed bus. Video adapter 624, in some embodiments, is implemented as a component of the CPU or as a component of a GPU.

The exemplary computer 600 of FIG. 6 includes a communications adapter 632 for data communications with other computers and for data communications with a data communications network. Such data communications are carried out serially through RS-232 connections, through external buses such as a Universal Serial Bus (USB'), through data communications networks such as IP data communications networks, and/or in other ways as will occur to those of skill in the art. Communications adapters 632 implement the hardware level of data communications through which one computer sends data communications to another computer, directly or through a data communications network. Such communication adapters 632 include modems for wired dial-up communications, Ethernet (IEEE 802.3) adapters for wired data communications, and 802.11 adapters for wireless data communications.

Figure 7:
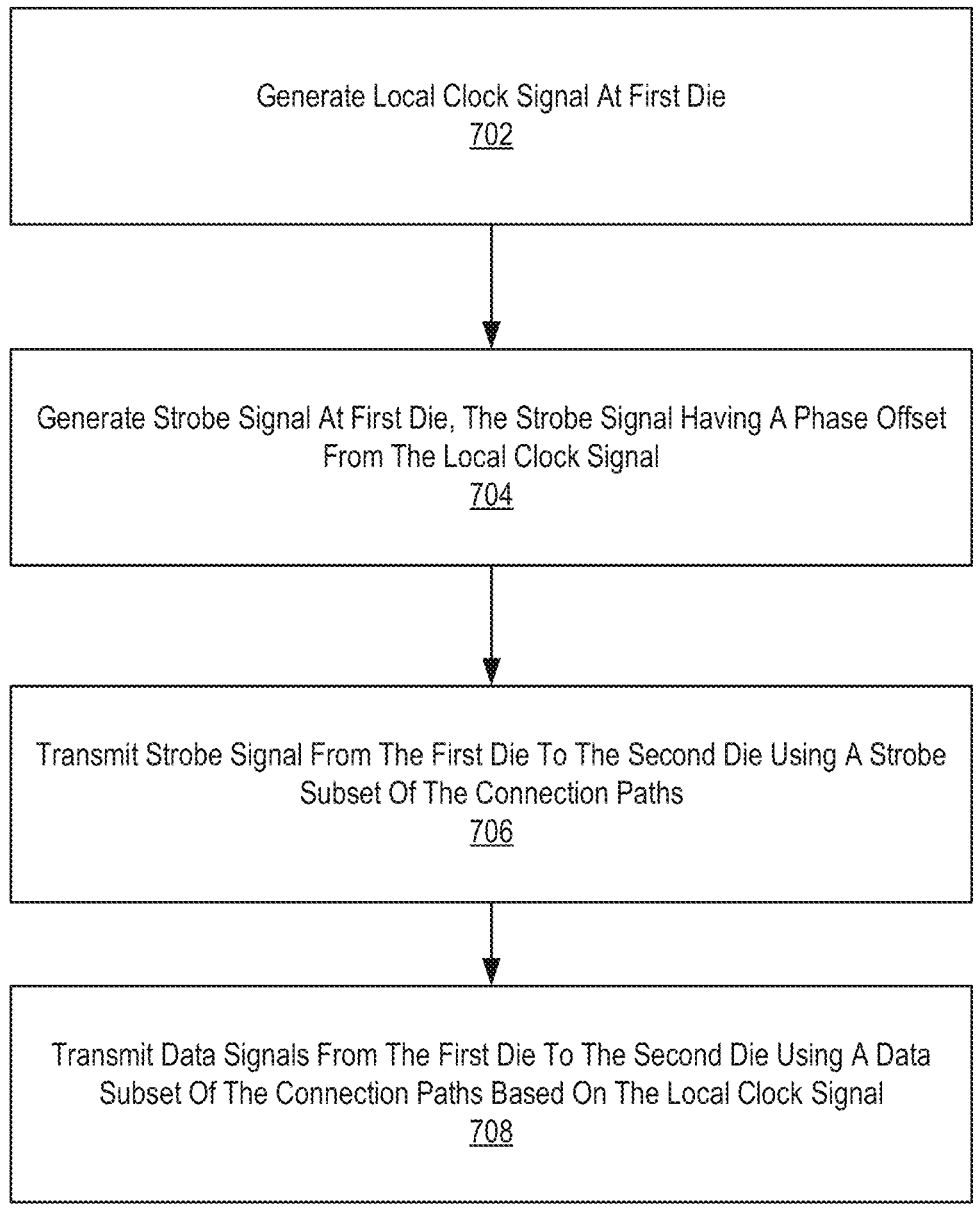
FIG. 7 is a flowchart of a method for offsetting clock jitter in a die-to-die interface according to some implementations.

For further explanation, FIG. 7 sets forth a flow chart illustrating an example method for offsetting clock jitter in a die-to-die interface. The method of FIG. 7 can be carried out in semiconductor packages similar to those described above with respect to FIG. 2 and FIG. 5. As such, description of the flow chart of FIG. 7 will be described with reference to objects depicted in FIG. 2.

The method of FIG. 7 includes generating 702 a local clock signal 214 at a first die 202a and generating 704 a strobe signal 216 at the first die 202a. The strobe signal 216 has a phase offset relative to the local clock signal 214. In various implementations, the strobe signal 216 has a ninety degree phase offset from the local clock signal 214.

In various implementations, the first die 202a includes a local clock generation circuit, such as a phase locked loop 212, that receives a signal from a clock 210. The clock 210 is included in a semiconductor package that includes the first die 202a, so the clock is external to the first die 202a. The signal from the clock 210 is used as a reference by the local clock generation circuit to generate 702 the local clock signal 214. Similarly, the local clock generation circuit generates the strobe signal 216 using the signal received from the clock 210. For example, the local clock generation circuit is a phase locked loop 212 that includes a delay loop, the local clock signal 214 is an output of the phase locked loop from a first position in the delay loop, while the strobe signal 216 is another output of the phase locked loop from a second position in the delay loop. Hence, the first position in the delay loop and the second position in the delay loop specify the phase offset between the local clock signal 214 and the strobe signal 216.

In some examples of the method of FIG. 7, the first die 202a is aligned with a second die 202b such that each connection point of a first plurality of connection points of the first die 202a is substantially equidistant to a corresponding connection point of a second plurality of connection points of the second die 202b. The connection points provide access points to the first die 202a and to the second die 202b for the transmission or reception of signals, including data signals and clock signals. In some implementations, the connection points are grouped in the first die 202a and in the second die 202b into a block of connection points for transmitting signals (e.g., first Tx block 204a, second Tx block 204b) and a block of connection points for receiving signals (e.g., first Rx block 206a, second Rx block 206b).

The first die 202a may be aligned with the second die 202b during fabrication of a semiconductor package (e.g., package 200 or 500). In an example, the first die 202a and second die 202b are placed on a carrier or other mechanical support and then encapsulated using an encapsulant or molding material. In some implementations, a first Tx block 204a of the first die 202a is linearly aligned with the second Rx block 206b of the second die 202b. Similarly, the second Tx block 204b of the second die 202b is linearly aligned with the first Rx block 206a of the first die 202a.

In some implementations, a layout of the first plurality of connection points corresponds to a one-hundred-and-eighty-degree rotation of a layout of the second plurality of connection points after alignment of the first die 202a and the second die 202b. In other words, the first die 202a and the second die 202b have matching connection point layouts. By virtue of a one-hundred-and-eighty-degree rotation of one die relative to the other, the first Tx block 204a of the first die 202a is linearly aligned with the second Rx block 206b of the second die 202b and the first Rx block 206a of first die 202a is linearly aligned with the second Tx block 204b of the second die 202b, as shown in FIG. 3. Thus, pairs of connection points across the first die 202a and the second die 202b that are to be coupled are substantially equidistant after the dies are aligned.

Each connection point of the first plurality of connection points is coupled to the corresponding connection point of the second plurality of connection points using a plurality of connection paths of a substantially same length. In some implementations, the plurality of connection paths is included in an interface 208 coupling the first die 202a and the second die 202b. The interface 208 includes a plurality of connection paths. Each connection path in the interface 208 couples an I/O connection point of the first die 202a (e.g., connection point Tx 6 of the first Tx block 204a) to another I/O connection point of the second die 202b (e.g., Rx 6 of the second Rx block 206b). As an example, the connection paths include conductive traces, wires, pins, vias, or other connection paths as can be appreciated.

The plurality of connection paths includes a data subset and a strobe subset. The data subset includes connection paths on which data is transmitted from the first die 202a to the second die 202b (or vice versa). For example, the data subset includes connection paths that are coupled to connection points on the first die 202a corresponding to the data transmitter 218 and coupled to connection points on the second die 202b corresponding to the data receiver 224. Hence, data signals are transmitted from the first die 202a to the second die 202b using connection paths of the data subset. The strobe subset includes connection paths on which the strobe signal 216 is transmitted from the first die 202a to the second die 202b. For example, the strobe subset includes connection paths that are coupled to connection points on the first die 202a corresponding to the strobe transmitter 220 and coupled to connection points on the second die 202b corresponding to the strobe receiver 222. In various implementations, the strobe subset includes fewer connection paths than the data subset.

The strobe signal is transmitted 706 from the first die 202a to the second die 202b using the strobe subset of the connection paths. Similarly, data is transmitted 708 from the first die 202a to the second die 202b using the data subset of the connection paths. The first die 202a transmits 708 data based on the local clock signal 214. For example, the first die 202a transmits 708 data on a rising edge of the local clock signal 214, while in other examples the first die 202a transmits 708 data on a falling edge of the local clock signal 214. In other examples, the first die 202a transmits 708 data on both a rising edge and a falling edge of the local clock signal 214.

As each connection path has substantially the same length and the same conductive characteristics, a simultaneous transmission of multiple signals from the first die 202a to the second die 202b results in substantially simultaneously receipt of the signals at the second die 202b. Because each connection path has substantially the same length, the phase offset between the strobe signal 216 and the data signals, which are transmitted by the first die 202a based on the local clock signal 214, is maintained from generation of the local clock signal 214 and the strobe signal 216 by the first die 202a to receipt of the data signals and the strobe signal 216 by the second die 202b. Internally, the second die 202b is configured so a delay from a connection point receiving the strobe signal 216 to a latch configured to sample data signals is substantially equal to a delay from a connection point receiving the data signal to the latch. Such approximate matching of delay times internal to the second die 202b allows the phase offset between the local clock signal 214 and the strobe signal 216 to be maintained when the Rx block 206b of the second die 202b samples the data signals. Thus, the phase offset between the data signals and the strobe signals 216 is maintained from generation to data sampling, simplifying configuration of the second die 202b by allowing the second die 202b (or the first die 202a) to omit a delay line for establishing the phase offset between the strobe signal 216 and the data signal (or the local clock signal 214). Such a configuration also mitigates skew in data transfer between the first die 202a and the second die 202b without the need for phase training or alignment, or frame training or alignment. Further, maintaining the phase offset between the data signals and the strobe signals 216, the strobe signals are centered in a data eye from initial generation of the strobe signals 216, with the positioning of the strobe signals 216 in the center of the data eye at initial generation allowing the phase offset between strobe signals 216 and data signals to be established and maintained without training a delay line at the first die 202a or in the second die 202b based on data eye characteristics.

In view of the explanations set forth above, readers will recognize many benefits of skew matching in a die-to-die interface, including, for example, improved performance of a computing system by remedying skew in die-to-die communications without frame training of phase training. Additionally, having a die locally generate a local clock signal and a strobe signal having a phase offset simplifies generation of the local clock signal and the strobe signal by allowing the phase offset between them to be configured without additional circuitry, such as a delay line. This simplification reduces a source of timing mismatch between the local clock signal (or data signals transmitted based on the local clock signal) and the strobe signal. Reducing the timing mismatches allows for transmission of data between a first die and a second die at a higher rate. Additionally, configuring the first die, the second die, and an interface between the first die and the second die, so routing delays from the PLL of the first die to a data receiver in a second die for the local clock signal substantially equal routing delays for the strobe signal allows the phase offset between the clock signal and the data signal maintained throughout die-to-die communication, reducing sources of jitter from different delays affecting the clock signal or affecting the strobe signal. Further, separately generating and distributing the clock signal and the strobe signal allows for finer control of clock gating, enabling use or more low power states that reduce overall power consumption for a semiconductor package.

Exemplary implementations of the present disclosure are described largely in the context of a fully functional computer system for skew matching in a die-to-die interface. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary implementations described in this specification are oriented to software installed and executing on computer hardware, nevertheless, alternative implementations implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some implementations, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to implementations of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various implementations of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A semiconductor package for skew matching in a die-to-die interface, comprising:
a first die including a first plurality of connection points and a phase locked loop, the phase locked loop configured to output a local clock signal and to output a strobe signal having a phase offset relative to the local clock signal, the local clock signal routed to a first transmit block of the first die and the strobe signal routed to the first transmit block of the first die;
a second die comprising a second plurality of connection points; and
a plurality of connection paths of a substantially same length, wherein each connection path couples a connection point of the first plurality of connection points to a corresponding connection point of the second plurality of connection points, the plurality of connection paths including a data subset of the connection paths for transmitting data signals from the first die to the second die based on the local clock signal and including a strobe subset of the connection paths for transmitting the strobe signal from the first die to the second die.

2. The semiconductor package of claim 1, wherein the phase offset is ninety degrees.

3. The semiconductor package of claim 1, wherein the second die is aligned with the first die and each connection point of the first plurality of connection points of the first die is substantially equidistant to a corresponding connection point of the second plurality of connection points of the second die.

4. The semiconductor package of claim 1, wherein a difference between a strobe delay and a data delay is less than a threshold, the strobe delay resulting from transmitting the strobe signal from the first die to the second die via the strobe subset of the connection paths, and the data delay resulting from transmitting the data signals from the first die to the second die via the data subset of the connection paths.

5. The semiconductor package of claim 4, wherein the strobe delay is a combination of a delay from routing the strobe signal from the phase locked loop to the first transmit block of the first die, a delay from transmitting the strobe signal from the first die to the second die via the strobe subset of the connection paths, and a delay from routing the strobe signal from connection points of the second plurality of connection points coupled to the strobe subset of the connection paths to a second receive block of the second die.

6. The semiconductor package of claim 5, wherein the data delay is a combination of a delay from routing the local clock from the phase locked loop to the transmit block of the first die, a delay from transmitting a data signal from the first die to the second die via the data subset of the connection paths, and a delay from routing the data signal from connection points of the second plurality of connection points coupled to the data subset of the connection paths to the receive block of the second die.

7. The semiconductor package of claim 1, wherein the first transmit block of the first die is linearly aligned with a second receive block of the second die and a second transmit block of the second die is linearly aligned with a first receive block of the first die.

8. The semiconductor package of claim 1, wherein the first transmit block is configured to transmit the strobe signal to a second receive block of second die via the strobe subset of the connection paths and the first transmit block is configured to transmit data signals to the receive block of the second die via the data subset of the connection paths.

9. The semiconductor package of claim 1, further comprising a clock coupled to the first die and the second die, the phase locked loop of the first die generating the local clock using a signal from the clock as a reference.

10. The semiconductor package of claim 1, wherein the first die further comprises:
a strobe interpolator having an input coupled to the phase locked loop and an output coupled to the first transmit block, the strobe interpolator configured to adjust a phase of the strobe signal.

11. The semiconductor package of claim 10, wherein the first die further comprises:
a clock interpolator having a clock input coupled to the phase locked loop and a clock output coupled to the first transmit block, the clock interpolator configured to adjust a phase of the local clock signal.

12. A method for transmitting data using a die-to-die interface, the method comprising:
generating a local clock signal at a first die;
generating a strobe signal at the first die, the strobe signal having a phase offset from the local clock signal;
transmitting the strobe signal from the first die to a second die via a strobe subset of connection paths; and
transmitting, based on the local clock signal, data signals from the first die to the second die via a data subset of connection paths, wherein:
the first die comprises a first plurality of connection points;
the second die comprises a second plurality of connection points; and
each connection point of the first plurality of connection points is coupled to a corresponding connection point of the second plurality of connection points through a connection path, each connection path comprising a substantially same length, and is included in one of: the data subset of connection paths for transmitting data from the first die to the second die based on the local clock signal and the strobe subset of connection paths for transmitting the strobe signal from the first die to the second die.

13. The method of claim 12, wherein each connection point of the first plurality of connection points of the first die is substantially equidistant to a corresponding connection point of the second plurality of connection points of the second die.

14. The method of claim 12, wherein a first transmit block of the first die is linearly aligned with a second receive block of the second die and a first transmit block of the second die is linearly aligned with a second receive block of the first die.

15. The method of claim 12, wherein a strobe delay from transmitting the strobe signal from the first die to the second die via the strobe subset of the connection paths is within a threshold amount of a data delay from transmitting the data signals from the first die to the second die via the data subset of the connection paths.

16. The method of claim 15, wherein the strobe delay is a combination of a delay from routing the strobe signal from a local clock generation circuit of the first die to a first transmit block of the first die, a delay from transmitting the strobe signal from the first die to the second die via the strobe subset of the connection paths, and a delay from routing the strobe signal from connection points of the second plurality of connection points coupled to the strobe subset of the connection paths to a second receive block of the second die.

17. The method of claim 16, wherein the data delay is a combination of a delay from routing the local clock from a local clock generation circuit of the first die to the first transmit block of the first die, a delay from transmitting a data signal from the first die to the second die via the data subset of the connection paths, and a delay from routing the data signal from connection points of the second plurality of connection points coupled to the data subset of the connection paths to the second receive block of the second die.

18. The method of claim 12, wherein generating the local clock signal at the first die comprises:
receiving a clock signal at a local clock generation circuit included in the first die; and
generating the local clock signal using the clock signal as a reference for the local clock generation circuit.

19. A semiconductor die comprising:
a phase locked loop and a transmit block, the transmit block comprising a first plurality of connection points, and a first plurality of connection segments, wherein:
the phase locked loop is configured to output a local clock signal and to output a strobe signal having a phase offset relative to the local clock signal;
the local clock signal and the first strobe signal are routed to the first transmit block; and
each of the first connection segments is coupled to one of the first plurality of connection points and is further configured to form a connection path by coupling to one of a second plurality of connection segments of a second die, each of the second plurality of connection segments coupled to one of a second plurality of connection points of the second die, wherein each connection path has a substantially same length.

20. The semiconductor die of claim 19, wherein each of the first plurality of connection points is configured to be substantially equidistant to a corresponding one of the second plurality of connection points of the second die when the second die is aligned with the first die.

* * * * *